US012334310B2

(12) United States Patent
Goebel et al.

(10) Patent No.: US 12,334,310 B2
(45) Date of Patent: Jun. 17, 2025

(54) HIGH CURRENT HEATERLESS HOLLOW CATHODE

(71) Applicant: CALIFORNIA INSTITUTE OF TECHNOLOGY, Pasadena, CA (US)

(72) Inventors: Dan M. Goebel, Tarzana, CA (US); Adele R. Payman, Pasadena, CA (US)

(73) Assignee: CALIFORNIA INSTITUTE OF TECHNOLOGY, Pasadena, CA (US)

( * ) Notice: Subject to any disclaimer, the term of this patent is extended or adjusted under 35 U.S.C. 154(b) by 252 days.

(21) Appl. No.: 18/339,194

(22) Filed: Jun. 21, 2023

(65) Prior Publication Data
US 2024/0014014 A1  Jan. 11, 2024

Related U.S. Application Data

(60) Provisional application No. 63/359,136, filed on Jul. 7, 2022.

(51) Int. Cl.
H01J 37/32 (2006.01)
F03H 1/00 (2006.01)

(52) U.S. Cl.
CPC ...... H01J 37/32596 (2013.01); F03H 1/0075 (2013.01)

(58) Field of Classification Search
CPC ............ H01J 1/025; H01J 37/32596
See application file for complete search history.

(56) References Cited

U.S. PATENT DOCUMENTS

| 6,137,231 | A | * | 10/2000 | Anders | H01J 37/3244 315/111.41 |
| 6,140,773 | A |   | 10/2000 | Anders et al. | |
| 6,388,381 | B2 |  | 5/2002 | Anders | |
| 10,723,489 | B2 | | 7/2020 | Conversano et al. | |
| 11,482,395 | B2 | | 10/2022 | Conversano et al. | |
| 2021/0175044 | A1 | * | 6/2021 | Conversano | H01J 29/861 |

OTHER PUBLICATIONS

Alexander J.N. Daykin-Iliopoulos, "Investigation of High Current Heaterless Hollow Cathode Ignition," Thesis for the degree of Doctor of Philosophy, University of Southampton, 2019 (Year: 2019).*

(Continued)

Primary Examiner — David P. Olynick
(74) Attorney, Agent, or Firm — Steinfl + Bruno LLP

(57) ABSTRACT

A heaterless hollow cathode with high current discharge capability for use in electric propulsion devices is presented. The heaterless hollow cathode includes a thermionic emitter insert having a tubular shape and arranged inside a hollow cathode tube. The heaterless hollow cathode further includes a propellant feed tube that longitudinally extends from an upstream region of the hollow cathode tube into an inner volume of the insert. According to one aspect, an extension of the propellant feed tube into the inner volume of the insert is in a range from one quarter to three quarters of a total longitudinal length of the insert. The propellant feed tube is made of a refractory metal that is capable of withstanding temperatures above 2200 degrees Celsius with negligible evaporation. According to another aspect, the refractory metal is tantalum or tungsten.

20 Claims, 6 Drawing Sheets

(56) References Cited

OTHER PUBLICATIONS

Becatti G. et al., "Demonstration of 25,000 ignitions on a protoflight compact Heaterless lanthanum hexaboride hollow cathode" Acta Astronautica, vol. 178, pp. 181-191, Sep. 2020. 11 pages.

Conversano R. et al., "Development and Initial Performance Testing of a Low-Power Magnetically Shielded Hall Thruster with an Internally-Mounted Hollow Cathode" *35th International Electric Propulsion Conference*, 2017. 11 pages.

Conversano R. et al., "Overview of the Ascendant Sub-KW Transcelestial Electric Propulsion System (ASTRAEUS)" *36th International Electric Propulsion Conference*, 2019. 21 pages.

Daykin-Iliopoulos, Alexander. J. N. et al. "Characterization of a 30 A Heaterless Hollow Cathode" IEPC-2019-802, 36th International Electric Propulsion Conference, Vienna, Austria, Sep. 2019. 14 pages.

Final Office Action Issued for U.S. Appl. No. 17/104,773, filed Nov. 25, 2020, on behalf of California Institute of Technology. Mail Date: Jun. 17, 2022. 6 Pages.

Goebel D. et al., "Fundamentals of Electric Propulsion: Ion and Hall Thrusters" John Wiley & Sons, Inc, 2008.

Goebel, Dan M. et al., "Heaterless 300 a lanthanum hexaboridehollow cathode" Rev. Sci. Instrum. 94, 033506 (2023); https://doi.org/10.1063/5.0135272. 7 pages.

Grubisic A. et al., "On-a-Chip Microdischarge Thruster Arrays Inspired by Photonic Device Technology for Plasma Television" ESA Feasibility Study, May 2009. 93 pages.

Hofer R. et al., "Magnetic shielding of a laboratory Hall thruster. II. Experiments" *Journal of Applied Physics*, vol. 115, 2014.

Kojima, K. et al. "Plasma Diagnostics in a High current Hollow Cathode" Trans. JSASS Aerospace Tech. Japan. vol. 17, No. 1, pp. 90-95. 2019. 6 pages.

Lev D. et al., "Heaterless Hollow Cathode Characterization and 1,500 hr Wear Test" *52nd AIAA/SAE/ASEE Joint Propulsion Conference*, 2016. 9 pages.

Lev D. "Heaterless Hollow Cathode Technology—A Critical Review" Space Propulsion Conference, May 2016, 12 pages.

Lev D. "Low current Heaterless hollow cathode neutralizer for plasma propulsion-Development overview" Rev. Sci. Instrum, Nov. 2019, 13 pages.

Lord P. et al., "Psyche : Journey to a Metal World" *IEEE Aerospace Conference*, 2017. 11 pages.

Mikellides I. G. et al., "Magnetic shielding of a laboratory Hall thruster. I. Theory and validation" *Journal of Applied Physics*, vol. 115, 2014. 21 pages.

Non-Final Office Action for U.S. Appl. No. 17/104,773, filed Nov. 25, 2020, on behalf of California Institute of Technology. Mail Date: Mar. 2, 2022. 11 Pages.

Notice of Allowance issued for U.S. Appl. No. 17/104,773, filed Nov. 25, 2020, on behalf of California Institute of Technology. Mail Date: Sep. 15, 2022. 7 Pages.

Payman, Adele R. et al., "Development of a 50—A heaterless hollowcathode for electric thrusters" Rev. Scl. Instrum. 93, 113543 (2022); https://doi.org/10.1063/5.0124694. 13 pages.

Vekselman V. et al., "Characterization of a Heaterless Hollow Cathode" Journal of Propulsion and Power, vol. 29, 2013, pp. 475-486.

Zhang H. et al., "High-Speed Camera Imaging of the Ignition Process in a Heaterless Hollow Cathode" IEEE Transactions on Plasma Science, 2019. 5 pages.

* cited by examiner

HIGH CURRENT HEATERLESS HOLLOW CATHODE

CROSS REFERENCE TO RELATED APPLICATIONS

The present application claims priority to and the benefit of U.S. provisional patent application Ser. No. 63/359,136 entitled "High Current Heaterless Hollow Cathode for the Next Generation High Power Electric Thrusters", filed on Jul. 7, 2022, the disclosure of which is incorporated herein by reference in its entirety.

STATEMENT OF GOVERNMENT GRANT

This invention was made with government support under Grant No. 80NMO0018D0004 awarded by NASA (JPL). The government has certain rights in the invention.

TECHNICAL FIELD

The present disclosure relates to electric propulsion devices. More particularly, it relates to a heaterless hollow cathode that can operate at high discharge currents, including discharge currents of 25 amperes and above. Applications can include any electric propulsion device, including (but not limited to) gridded ion thrusters or Hall thrusters.

BACKGROUND

An electron source is a critical component of electric propulsion (EP) devices, including gridded ion and Hall thrusters. These thrusters use hollow cathodes, such as the hollow cathode (100) shown in FIG. 1, to produce the required electrons via an enclosed thermionic emitter (a.k.a. insert, cathode insert, cathode emitter) that once elevated to a temperature, generally in the range of 1100° C.-1700° C. (Celsius), produces sufficient electron current to operate the EP thruster.

The term "hollow" derives from the geometry of the cathode which, as shown in the prior art cathode (100) of FIG. 1, includes a cathode tube (labelled in the FIG. 1 as Cathode Tube) that is cylindrical (e.g., tubular) in shape with an internal hollow space within which a hollow cylindrical thermionic emitter (labelled in FIG. 1 as Insert) is fitted. Conventionally, an external heater (labelled in FIG. 1 as Heater) is wrapped around the outside of the cathode tube and used to start thermionic emission of the emitter. As used herein, the term "cathode", or "hollow cathode", may refer to the combination of the cathode tube, the emitter, the heater and the optional orifice plate (labelled in FIG. 1 as Orifice Plate). As used herein, the term "heaterless cathode" refers to a cathode that does not include a heater or heating element (as known in the art).

As can be seen in FIG. 1, the insert of the prior art cathode (100) is also cylindrical in shape with an outside diameter that is substantially equal to the constant inside diameter provided by the internal hollow space of the cathode tube, which allows a slip fit of the insert within the cathode tube. Likewise, the internal hollow space of the emitter is cylindrical in shape and therefore has a substantially constant diameter in the prior art cathode. As shown in FIG. 1, the emitter is positioned at a downstream side of the cathode such that one end of the emitter is at a vicinity of a downstream exit of the cathode.

As shown in FIG. 1, the downstream exit of the cathode may include an (optional) orifice plate (labelled in FIG. 1 as Orifice Plate) having a center opening/orifice. The orifice plate may be fabricated as a separate part that is fixated to a downstream end of the cathode tube or may be fabricated as an integral part of the cathode tube with additional fabrication cost. It should be noted that in some implementations the orifice plate may not be present as the downstream exit may be the entirety of the downstream opening of the cathode tube. Teachings according to the present disclosure may equally apply to either implementation (with or without orifice plate).

During operation, propellant (gas, e.g., Xenon, Krypton, Argon, etc.) may be fed into the prior art cathode (100) via a feed tube (labelled in FIG. 1 as Feed Tube) that connects to a base of the cathode (labelled in FIG. 1 as Base) used for mounting of the cathode tube. Accordingly, as shown in FIG. 1, the propellant, under pressure, is pushed into an inner space (volume) of the cathode tube, including an inner space of the insert, and is ionized by electron bombardment as it passes through the insert. Accordingly, a plasma discharge, produced by ionization of the propellant, exits through the exit (e.g., opening, labelled as Exit in FIG. 1) provided by the cathode orifice plate and couples to an external anode of the electric thruster (e.g., Anode of FIG. 2).

As known to a person skilled in the art, the emitter may be fabricated with materials that can provide thermionic emission when heated. Common emitter materials with proven practicality include barium oxide impregnated porous tungsten (BaO—W) and lanthanum hexaboride ($LaB_6$). Traditionally, and as shown in FIG. 1, the prior art cathode (100) uses a coaxial heating element, Heater, wrapped around the outside of the cathode tube to raise the emitter to thermionic emission temperatures after which a plasma discharge can be initiated to an external anode (e.g., Anode shown in FIG. 2) or thruster plasma. Once started using the heater, the plasma discharge is "self-heating" due to the plasma resistance and discharge current, and it maintains sufficiently high emitter temperatures to produce the desired current. The external heater can then be turned off. Despite this occasional usage of the external heater element just to start the thermionic emission of the cathode (100), heater failures are problematic and have even resulted in the loss of electric thrusters in flight due to the inability to ignite the cathode (100).

There has been some recent development of heaterless hollow cathodes, most of which are small hollow cathodes (capable of only a few amperes) used in low-power (sub-kW) EP devices. FIG. 2 shows a simplified schematic of a prior art implementation of an EP device (200) including three electrodes: a heaterless hollow cathode, an anode and a keeper. As can be seen in FIG. 2, the heaterless hollow cathode of the EP device (200) is based on the prior art cathode of FIG. 1 but without the heating element. The EP device (200) further includes a keeper electrode (labelled in FIG. 2 as Keeper) and associated power supply (labelled in FIG. 2 as Keeper PS), and an anode electrode (labelled in FIG. 2 as Anode) and associated power supply (labelled in FIG. 2 as Anode PS). In other words, the heaterless hollow cathode used in the EP device (200) of FIG. 2 includes geometries according to the description above with reference to FIG. 1, including constant outer and inner diameters of the thermionic insert along the entirety of the longitudinal/axial extension of the insert. Furthermore, similarly to the prior art cathode of FIG. 1, propellant to the heaterless hollow cathode of FIG. 2 is provided via a feed tube (labelled in FIG. 2 as Feed Tube) that connects to a base (e.g., Base) of the heaterless hollow cathode. It should be noted that although not shown in the figures of the present disclosure, the keeper structure may be supported by the base while being electrically isolated from the base.

As known to a person skilled in the art, all heaterless hollow cathodes, including one shown in FIG. 2, rely on the generation of an electrical breakdown known as a "Paschen breakdown" to both heat the cathode and ignite a plasma discharge (e.g., also referred to as Paschen discharge). In general, a Paschen (electrical) breakdown is a high voltage, low current discharge that is struck between the cathode orifice plate and the keeper electrode at the downstream exit of the cathode.

The Paschen ignition process requires: a) a high voltage to be applied between the cathode and the keeper (e.g., via Keeper PS of FIG. 2, typically 500 to 2000 V), and b) a high gas flow (e.g., Propellant shown in FIG. 2) to be injected (e.g., via the feed tube) at an upstream entry into the cathode to increase the pressure in a gap region (labelled as Gap in FIG. 2) between the orifice plate and the keeper to a threshold level. In turn, application of the high voltage and the high gas flow cause occurrence of an electrical breakdown in the gap between the cathode and the keeper. Once the gap electrically breaks down, a plasma discharge in a region of the gap heats the orifice plate which in turn heats the thermionic insert (i.e., emitter) of the cathode to thermionic emission temperatures. Once the thermionic insert is hot enough to emit electrons, the plasma discharge preferentially transitions from the exterior of the orifice plate to the inside of the hollow cathode and attaches to the insert (inner) surface. The discharge may then be connected to the anode by applying a positive electrical potential to the anode, after which the keeper PS may be turned off, and normal (e.g., steady state) hollow cathode operation to the anode may be obtained.

The benefits of a heaterless cathode are numerous, including relatively short cathode ignition times (generally 100's of ms to 1's of seconds for low discharge current cathodes), removal of the external cathode heater (which is considered an EP system single-point failure), and the elimination of the cathode heater power supply in the EP system's power processing unit (PPU). Some disadvantages of using a heaterless system are the high voltage and high gas flow rates required, necessitating a PPU that has a high voltage keeper power supply (e.g., Keeper PS of FIG. 2) to ignite and sustain the Paschen discharge until the thermionic emission starts and a propellant flow controller capable of delivering propellant flow rates on the order of 10× to 100× nominal during ignition. Furthermore, the Paschen discharge can easily transition into an arc discharge if the arc current is not well controlled or too high, possibly creating significant damage to the cathode and/or keeper electrodes.

The location of the Paschen breakdown in the cathode geometry depends on a pressure times distance (p*d) effect and can occur at locations of high (local) pressure (e.g., gas density) and relatively large electrode distances. Accordingly, such locations may include the two axial extremes of the cathode structure, including the desirable location of the exit provided by the orifice plate and the undesirable location of the propellant entry provided at the connection between the feed tube and the base of the cathode. If the Paschen breakdown connects/couples to the feed tube located upstream of the cathode insert region, the plasma heating occurs in a location away from the insert and ignition may not be possible. The coupling of the Paschen breakdown to locations that are not to the cathode orifice plate or the insert is a major concern as the local plasma generated by the Paschen breakdown can also cause significant damage to the cathode. Notably, it can sputter erode internal surfaces of the cathode which are not designed to withstand such erosion and/or heat regions of the cathode beyond their intended operating temperature range. Both of these can lead to potential failure of the prior art heaterless cathode assembly shown in FIG. 2.

In order to avoid coupling of the Paschen breakdown upstream the of the cathode insert, some heaterless hollow cathode configurations may include a small constriction at the upstream end of the cathode insert, as shown in the configuration (300) of FIG. 3. The constriction makes it difficult for the plasma discharge to penetrate to the gas feed line (feed tube), forcing the Paschen discharge to attach directly to the upstream end of the insert instead. However, such design is limited to low discharge currents (i.e., about 4 amperes during steady state operation) and scaling up of the design for support of higher heater power levels needed to heat larger cathodes that can produce higher discharge currents in a range of up to 35 amperes or more may cause arcing (and therefore erosion) in a region of the constriction. In other words, to get higher heater power required for larger cathodes, the Paschen discharge current may need to be increased (e.g., over 1 A), which in turn may lead to arcing that may damages the cathode. Such arcing not only may inhibit heating of the insert but may also severely erode the insert surfaces and damage the cathode.

Teachings according to the present disclosure describe a heaterless hollow cathode which can be operated at higher discharge currents of up to 35 amperes or more (e.g., 300 amperes) while overcoming the above-described issues of the prior art heaterless hollow cathodes, including arcing and Paschen breakdown connection upstream of the cathode insert region.

SUMMARY

According to a first aspect of the present disclosure, a high current heaterless hollow cathode is presented, comprising: a cathode tube having an inner cylindrical hollow space that defines a longitudinal extension of the high current heaterless hollow cathode; a thermionic emitter arranged in a downstream region of the inner cylindrical hollow space of the cathode tube; and a propellant feed tube that longitudinally extends from an upstream region of the inner cylindrical hollow space of the cathode tube into an inner volume of the thermionic emitter.

According to a second aspect of the present disclosure, a method for reliably producing a high discharge current in a heaterless hollow cathode is presented, the method comprising: providing a thermionic emitter; fitting the thermionic insert into a cathode tube, thereby obtaining a heaterless hollow cathode; fitting a propellant feed tube made from a refractory metal into the cathode tube, the propellant feed tube extending into an inner volume of the thermionic emitter; partially surrounding the heaterless hollow cathode with a keeper electrode; applying a potential difference between the heaterless hollow cathode and the keeper electrode; and based on the applying, generating an electric discharge that is electrically coupled to an end of the propellant feed tube located in the inner volume of the thermionic emitter, the electric discharge being a Paschen discharge.

Further aspects of the disclosure are provided in the description, drawings and claims of the present application.

BRIEF DESCRIPTION OF DRAWINGS

The accompanying drawings, which are incorporated into and constitute a part of this specification, illustrate one or more embodiments of the present disclosure and, together with the description of example embodiments, serve to explain the principles and implementations of the disclosure. Same reference designators refer to same features.

Like reference numbers and designations in the various drawings indicate like elements.

DETAILED DESCRIPTION

Throughout the present disclosure, embodiments and variations are described for the purpose of illustrating uses and implementations of inventive concepts of various embodiments. The illustrative description should be understood as presenting examples of the inventive concept, rather than as limiting the scope of the concept as disclosed herein.

Figure 1:
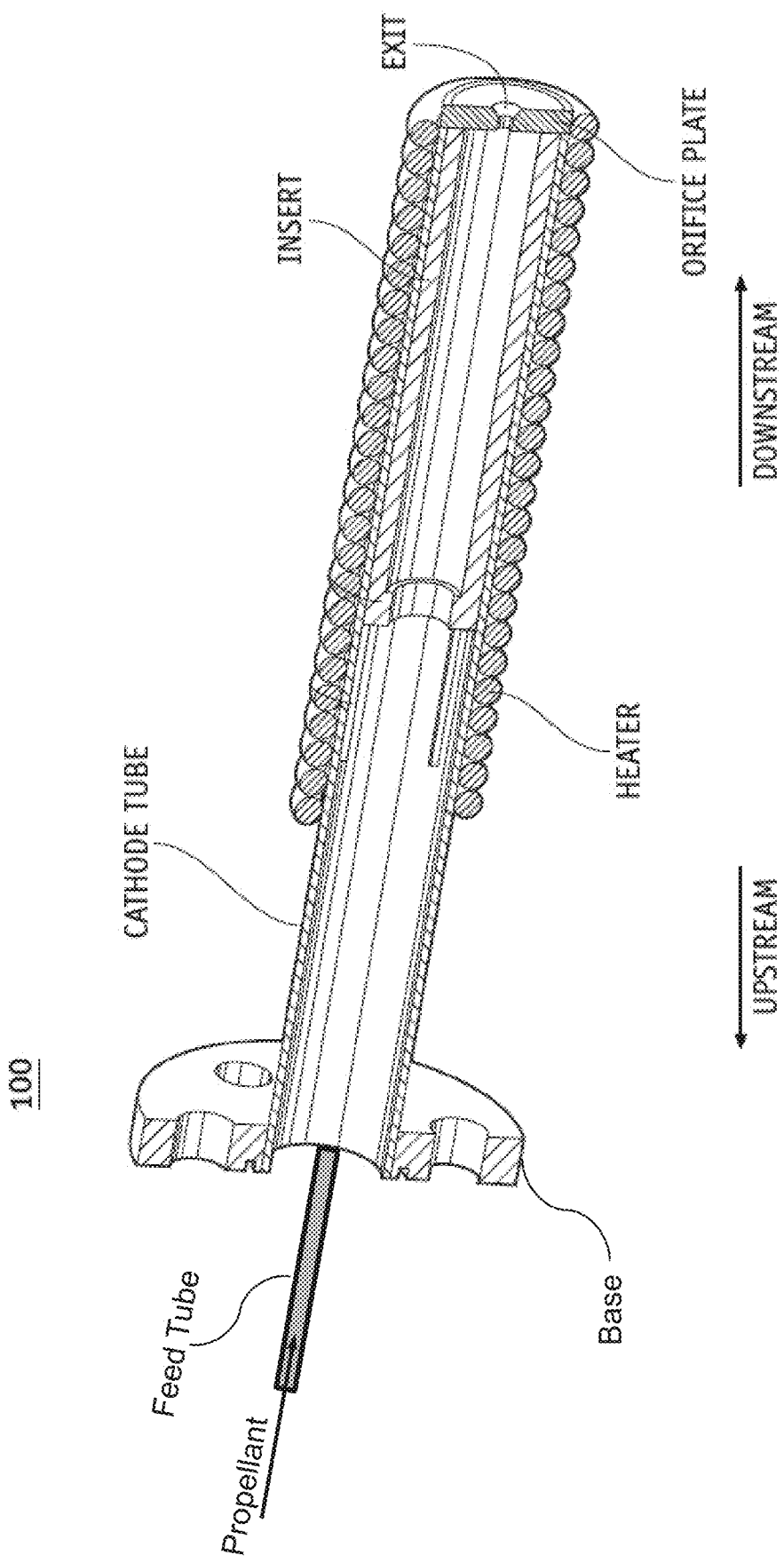
FIG. 1 shows a schematic of a prior art hollow cathode.
Figure 2:
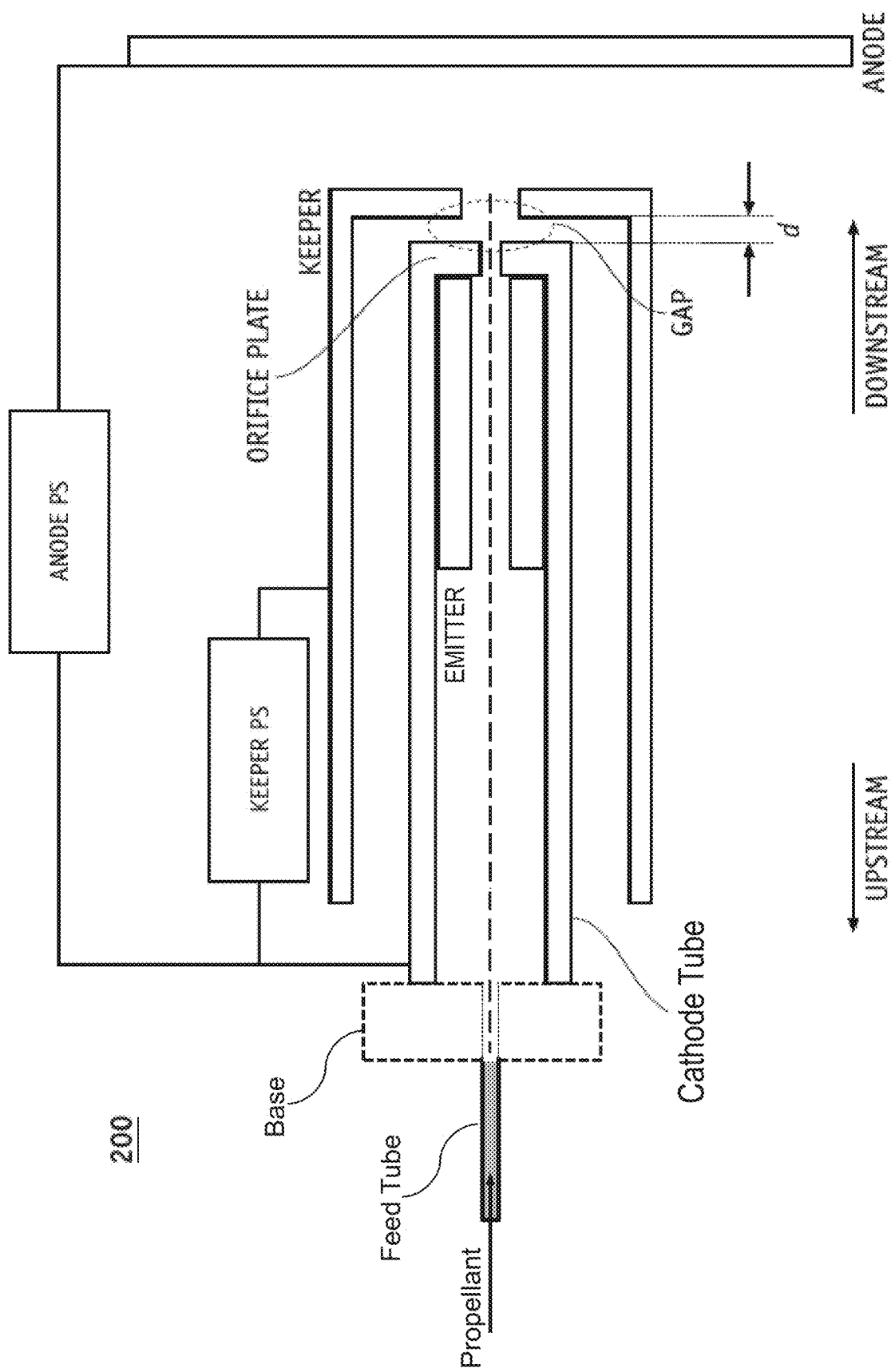
FIG. 2 shows a simplified electrical schematic of a prior art EP device including a heaterless hollow cathode.
Figure 3:
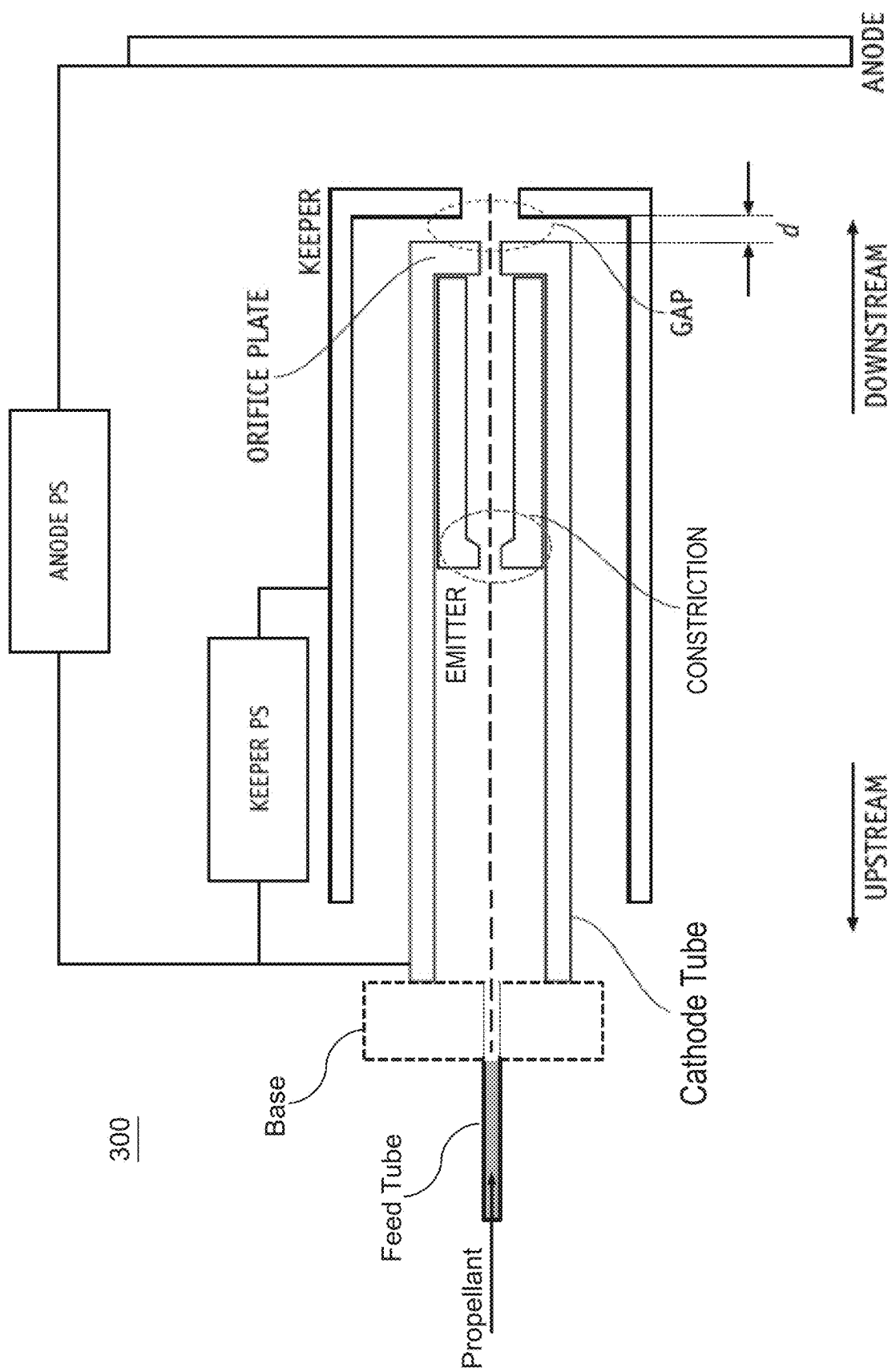
FIG. 3 shows a simplified electrical schematic of another prior art EP device including a heaterless hollow cathode.

Teachings according to the present disclosure aim at maintaining benefits provided by a heaterless hollow cathode while eliminating the above-described related issues, including arcing at higher discharge currents and Paschen breakdown connection upstream of the cathode insert region. Accordingly, the heaterless hollow cathode according to the present disclosure may be able to operate at higher discharge currents in a range from 25 to 100 amperes and even higher (e.g., over 300 amperes). In turn, the heaterless hollow cathode according to the present disclosure may allow implementation of EP thrusters (e.g., Hall thrusters) capable of reliably producing a power output of 10 kW and above, or in other words, a power output that is at least one order of magnitude higher than the power output produced by thrusters using the (lower current, e.g., 4 amperes) prior art heaterless hollow cathodes described above with reference to FIGS. 2-3.

Higher discharge currents may be provided by scaling up geometries of the heaterless hollow cathode such as to provide larger (inner) volumes and surface areas which in turn may require higher heating power during startup/ignition of the cathode. Two issues with the Paschen heating technique may emerge in larger cathodes. First, prolonged exposure to a Paschen discharge may lead to high erosion rates on the insert and orifice plate from sputtering by energetic ions accelerated across the high-voltage cathode sheath. Second, since the voltage of a Paschen discharge is dependent on the cathode geometry and (propellant) flow rate, the practical way to supply more power is to raise the current, which increases the likelihood of arcing on the insert and other components in contact with the plasma. Arcs concentrate all the energy of the discharge into localized cathode spots, causing pitting and sputtering damage to the surfaces they attach to. The rough surface structure of the insert makes it particularly susceptible to arcing when a Paschen discharge attaches directly to its surface. Teachings according to the present disclosure address such issues by providing an alternate connection location (e.g., feed tube of FIG. 4A) for the Paschen discharge and potential arcing that includes a surface made from a robust material capable of withstanding thousands of startups/ignitions.

Figure 4A:
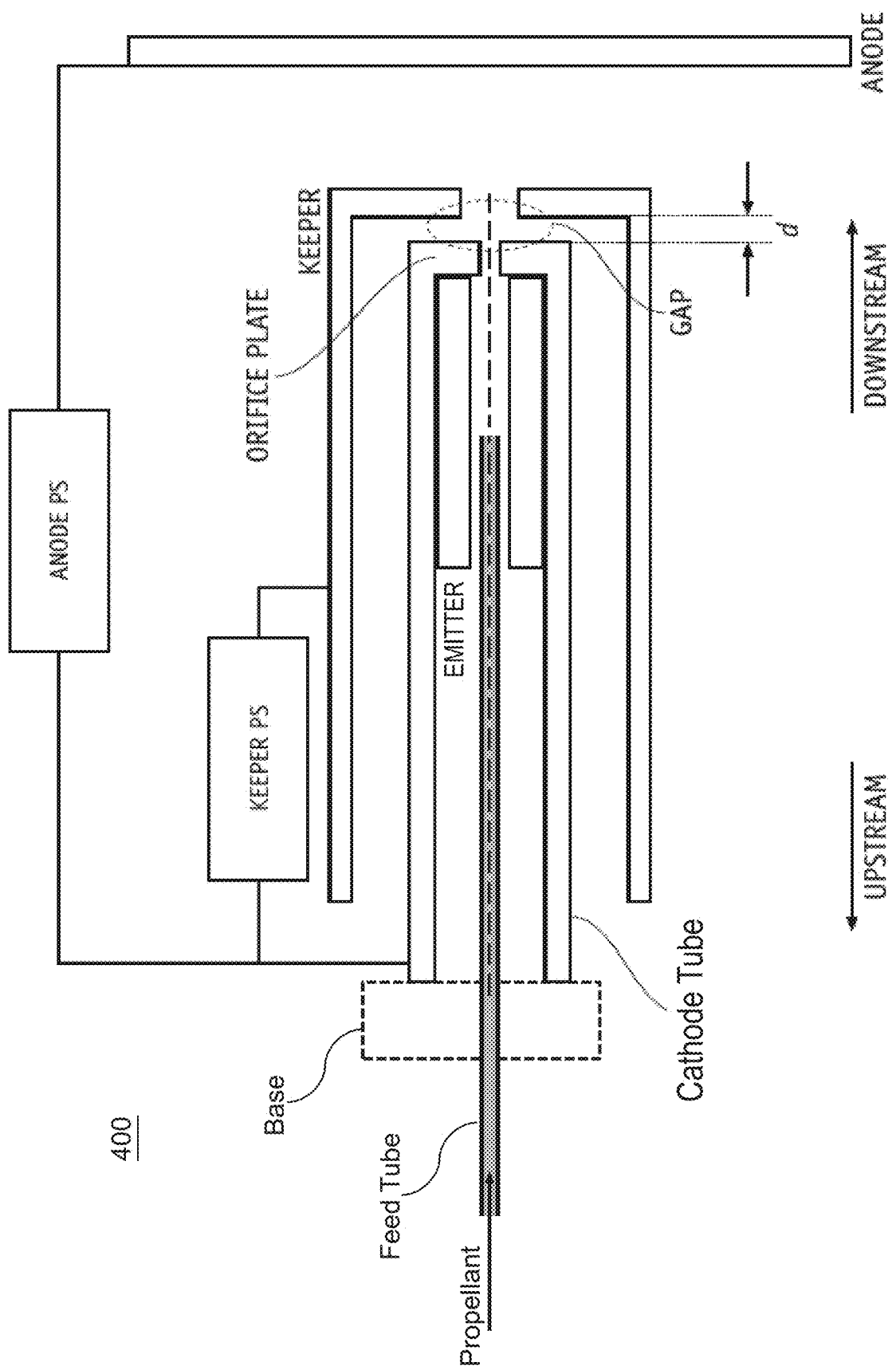
FIG. 4A shows a simplified electrical schematic of an EP device including a high current heaterless hollow cathode according to an embodiment of the present disclosure.

Teachings according to the present disclosure exploit the natural tendency of the Paschen discharge to couple to and directly heat the interface region of the propellant feed tube (i.e., feed line) by extending, as shown in the configuration (400) of FIG. 4A, the feed tube through the heaterless cathode structure and into an inner space/volume of the thermionic emitter insert. By extending the feed tube into the inner space/volume of the insert, when the Paschen discharge is ignited between the tip region of the feed tube (i.e., open/downstream end of the tube into the inner space/volume of the insert) and the keeper, the heat generated in the tube radiates directly to the insert, instead of conducting away according to the prior art configurations, thereby effectively promoting thermionic emission of the insert.

Startup operation (e.g., ignition) for provision of the thermionic emission of the heaterless hollow cathode according to the present teachings may be summarized by the following steps: a Paschen discharge forms between the tip region of the feed tube and the keeper; the Paschen discharge heats the tip region of the feed tube to high temperatures; the high temperatures in combination with the high discharge voltage cause the feed tube to emit electrons/current, thereby further heating the feed tube till the heat tube becomes a thermionic electron emitter, thereby dropping/lowering the voltage of the Paschen discharge (e.g., to 60-80 V); heat from the now thermionic feed tube radiates to the insert (e.g., $LaB_6$, BaO—W, etc.), thereby heating the insert to thermionic emission temperatures. When the insert starts emitting electrons, the discharge voltage further drops (e.g., to <40 V) to a level that may not provide sufficient voltage (e.g., power) to the feed tube to sustain the discharge because of a required higher work function. Accordingly, the (Paschen) discharge between the tip region of the feed tube and the keeper turns off and the insert discharge takes over for steady state operation of the heaterless hollow cathode. It should be noted that thermionic emission of the feed tube may be required in order to generate sufficient heater power for the time it may take to heat the larger cathode while not eroding various surfaces at high voltage. For example, for a 50 amperes cathode, about 120 W of heater power for about 3 minutes may be sufficient to heat the insert, so when the thermionic discharge causes the voltage to fall to 50-60 V, about 2.5 amperes of current from the feed tube may be required. On the other hand, for a larger 300 amperes cathode, about 300 W of heater power may be needed, which may be provided by a feed tube current of about 5-6 amperes at the 50-60 V. Furthermore, it should be noted that the feed tube may have a work function (e.g., about 4.2 eV) that may be higher compared to a work function of the insert (e.g., about 2.67 for $LaB_6$ insert), and therefore the feed tube may need to be at a higher temperature (e.g., over 2200 C) compared to the temperature (e.g., about 1500 C) of the insert in order to be hot enough to emit a same current (e.g., 2-4 A).

With continued reference to FIG. 4A, according to an embodiment of the present disclosure, a portion of the feed tube that extends into the insert, may be made from a refractory metal that may withstand the higher temperatures required for thermionic emission (e.g., capable of producing 1-4 amperes or even higher of keeper current, higher keeper currents may be required for higher cathode currents, such as, 6/10 amperes keeper current for 300/500 amperes cathode currents) during the above-described startup/ignition operation. According to a nonlimiting exemplary embodiment of the present disclosure, such refractory metal may include tantalum or tungsten. In some exemplary embodiments, molybdenum may be used. At the higher temperatures (e.g., 2200 degrees Celsius and higher) required to thermionically produce the 1-4 amperes of keeper current, such refractory metal may exhibit negligible evaporation, thereby allowing the feed tube to withstand/support over ten thousand of startups. It should be noted that other refractory metal may be used so long they are able to withstand temperatures above 2200 degrees Celsius with evaporation rates sufficiently low as to not affect the number of startups. It should be noted that the portion of the feed tube according to the present disclosure that extends into the insert, and therefore internal to the cathode, may be referred to as a "heat tube" since it is used as a heating element to the insert. Life expectancy of such heating element may be provided by a number of startups/ignitions supported by the heating element and based on an evaporation rate of the refractory metal at high temperatures (e.g., above 2200 degrees Celsius).

Besides efficient heating from the inside (i.e., inner space/volume) provided by the extended feed tube of the heaterless hollow cathode (400) of FIG. 4A, arcing to the cathode orifice plate and/or the insert may be eliminated, thereby allowing higher power heating required for larger high current operation of the cathode (400). Because the discharge during the startup operation of the cathode is located inside the higher-pressure refractory metal heat tube, transition of the discharge to arcs may be essentially inhibited. Furthermore, even if arcing occurs, such arcing may occur on the robust refractory metal inside/of the heat tube instead of the fragile inner surface material of the insert (e.g., $LaB_6$, BaO—W, etc.).

The feed tube shown in FIG. 4A may include a portion that is external to the cathode, and which may attach (e.g., weld) to the base (labelled as Base in FIG. 4A) of the cathode. The feed tube may further include the portion that is internal to the cathode having an upstream end that attaches (e.g., welds) to the base and a downstream end that extends into the emitter. The external portion of the feed tube may be in fluidic contact with the internal portion of the feed tube via a channel (fluidic path) provided through the base. It should be noted that the external portion of the feed tube may be made from a material that is same or different (e.g., stainless steel) from the material (refractory metal) used in the internal portion of the feed tube. According to some exemplary nonlimiting embodiments, the external and internal portions of the feed tube may form a single feed tube that is inserted/guided (and sealed) through the base of the cathode.

Figure 4B:
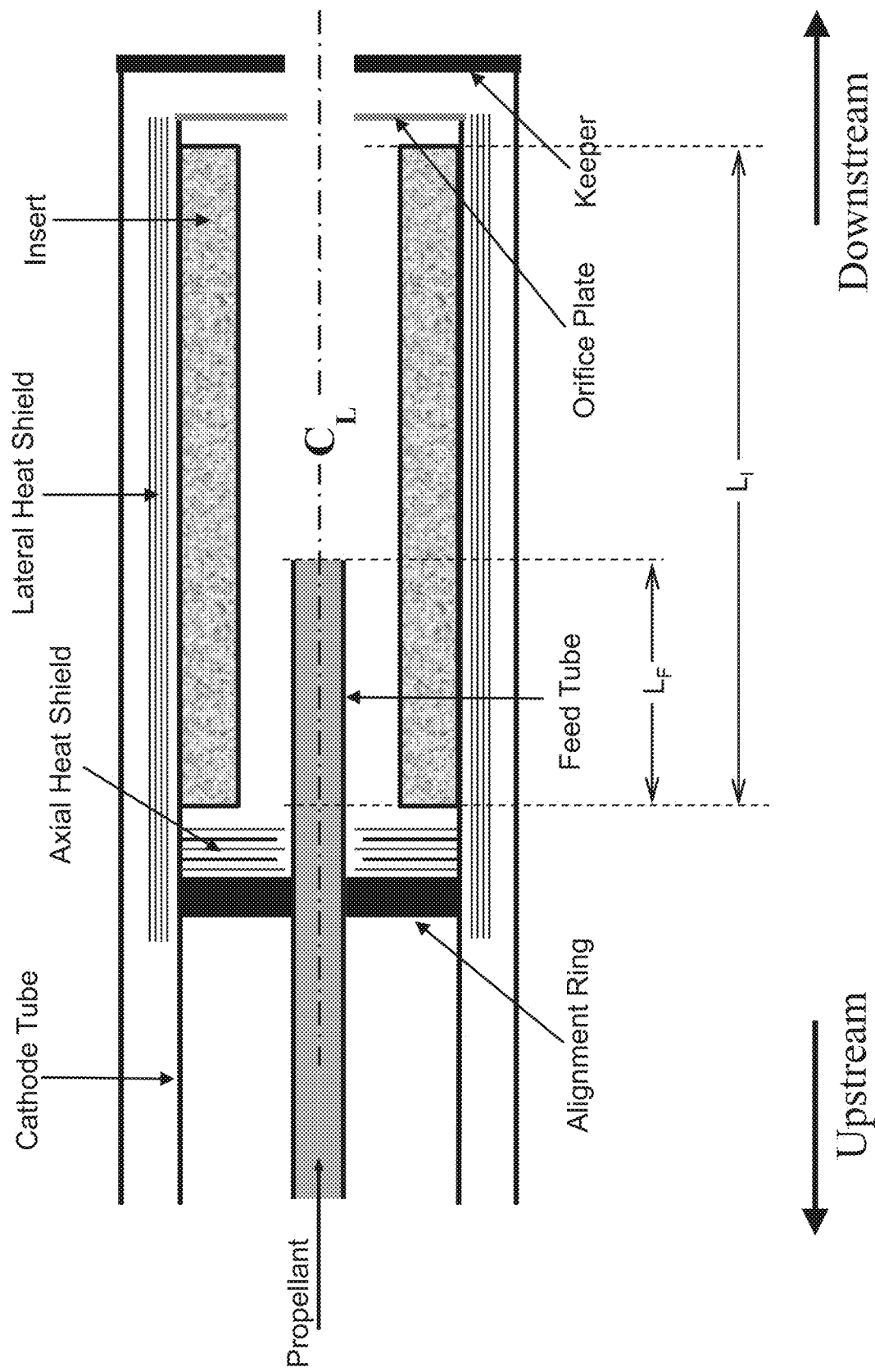
FIG. 4B shows further details of the high current heaterless hollow cathode according to the present disclosure.

FIG. 4B shows further details of the high current heaterless hollow cathode according to the present disclosure. In particular, as shown in FIG. 4B, the insert has length in the longitudinal/axial extension of the cathode that is equal to $L_I$, and the feed tube extends into an inner region (space/volume) of the insert by a length, $L_F$. According to an embodiment of the present disclosure, the length $L_F$ may be in a range from $0.25 \times L_I$ to $0.75 \times L_I$. In other words, an extension of the feed tube into the inner region of the insert is in a range from one quarter to three quarters of a total longitudinal length (i.e., $L_I$) of the insert. In other words, the inner region of the insert that contains a downstream end of the feed tube may be axially located within a distance of $+/-0.25 \times L_I$ from the center of the insert. It should be noted that the length, $L_F$, according to the present disclosure may be configured to provide an extension of the feed tube into the inner region of the insert that is sufficiently far for efficient radiation of heat from the feed tube to the insert, but not so far to interfere with the normal (e.g., steady state) operation of the cathode provided by thermionic emission of the insert. It should be noted that a wall thickness (e.g., half difference between outer and inner diameter) of the feed tube may determine the life and number of ignitions possible. For example, a wall thickness in a range from 0.5 mm to 1 mm thick may provide over five thousand ignitions.

With continued reference to FIG. 4B, according to a nonlimiting embodiment of the present disclosure, the length of the insert, $L_I$, may be in a range from 2.0 cm to 3.0 cm, and an inner diameter of the insert may be in a range from 0.50 cm to 0.70 cm. Such dimensions may allow thermionic emission of discharge currents up to 100 amperes (e.g., 35-100 amperes) with $LaB_6$ as insert material. Other dimensions and/or material may be used based on a desired performance of the insert. For example, for the same material insert, lowering the inner diameter of the insert to within a range from 0.40 cm to 0.50 cm may allow thermionic emission of discharge currents up to 50 amperes (e.g., 35-50 amperes), whereas increasing the inner diameter of the insert to within a range from 0.50 cm to 1.30 cm and increasing the length of the insert to within a range from 2.0 cm to 5.0 cm may allow thermionic emission of discharge currents up to 300 amperes (e.g., 35-300 amperes).

With continued reference to FIG. 4B, according to an embodiment of the present disclosure, an alignment ring (labelled in FIG. 4B as Alignment Ring) may be provided within the heaterless cathode at the upstream end of the insert. The alignment ring may include a central opening through which the feed tube may be guided. The central opening (e.g., center hole for passage of the feed tube)) may be aligned with a centerline (labelled as $C_L$ in FIG. 4B, e.g., axial center) of the cathode/insert so to align hold the feed tube concentrically with the insert (and therefore with the cathode tube). According to a nonlimiting embodiment of the present disclosure, the alignment ring may be made from graphite. According to further nonlimiting embodiments, the alignment ring may be made from any refractory metal capable of withstanding the temperature of the feed tube when hot, such refractory metal may include, for example, tantalum, molybdenum, tungsten, etc.

With further reference to FIG. 4B, the alignment ring may be separated from the insert by an axial heat shield that may have a form/shape similar to the alignment ring and configured to shield the alignment ring (and other downstream components) from the high temperatures heat radiated from the (tip region) of the feed tube. Although not shown in the figure, the alignment ring may include a plurality of stacked alignment rings interleaved with spacers, wherein the stacked alignment rings may include off-axis holes to prevent a straight through line of sight for the propellant/gas which may therefore follow a tortuous path through the off-axis holes. Similarly, a lateral heat shield may surround the outer surface of the heaterless cathode and extend throughout a (high temperature) longitudinal extension that encompasses the insert. According to a nonlimiting embodiment, the axial/lateral heat shield may be made from a material that includes refractory metals such as tantalum, molybdenum, tungsten and graphite materials such as GraFoil.

Figure 4C:
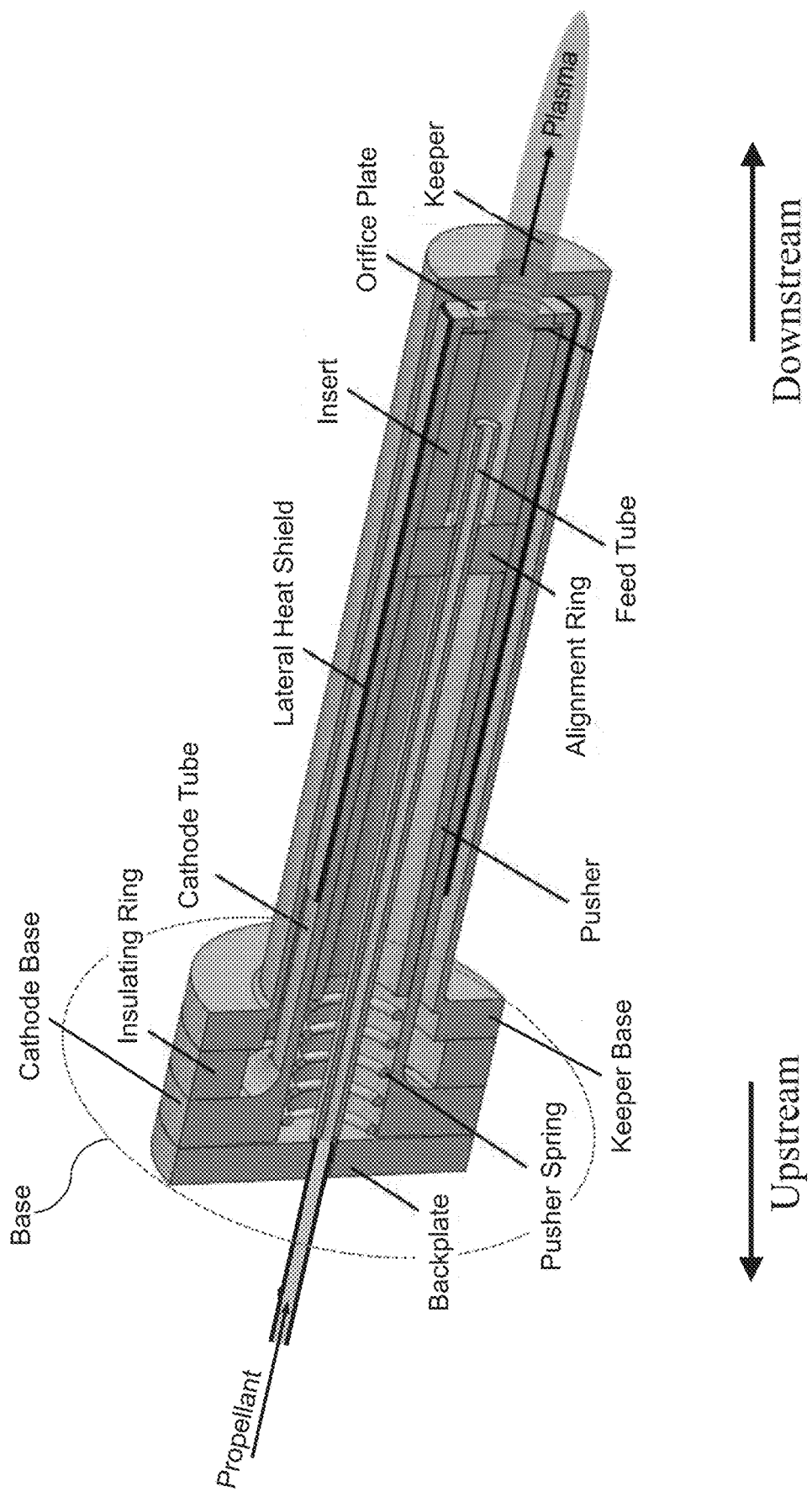
FIG. 4C shows a cross section of an actual implementation of a high current heaterless hollow cathode according to the present disclosure.

FIG. 4C shows a cross section of an actual implementation of the high current heaterless hollow cathode according to the present disclosure. In particular, shown in FIG. 4C is a pusher spring (labelled as Pusher Spring) arranged between a flat surface of a backplate (labelled as Backplate) of the base and a cylindrical structure (e.g., Pusher) that loads/pushes the alignment ring against an upstream surface of the insert. An insulating ring (labelled as Insulating Ring) may be arranged between the base of the keeper (labelled as Keeper Base) and the base of the heaterless cathode (labelled as Heaterless Cathode Base). Also shown in FIG. 4C is the plasma/Paschen discharge (labelled as Plasma) that forms during the startup/ignition of the cathode between the tip region of the feed tube and the keeper, the plasma extending outside the cathode structure through a hole in the keeper.

Some exemplary nonlimiting materials that may be used in the various components of the high current heaterless hollow cathode shown in FIG. 4C may include steel for the backplate, alumina for the insulating ring and the pusher, molybdenum or graphite for the cathode tube (and cathode base), graphite for the keeper (and keeper base), and tantalum (foil) for the lateral shield. Other materials as known in the art may be used.

A number of embodiments of the disclosure have been described. Nevertheless, it will be understood that various modifications may be made without departing from the spirit and scope of the present disclosure. Accordingly, other embodiments are within the scope of the following claims.

The examples set forth above are provided to those of ordinary skill in the art as a complete disclosure and description of how to make and use the embodiments of the disclosure and are not intended to limit the scope of what the inventor/inventors regard as their disclosure.

Modifications of the above-described modes for carrying out the methods and systems herein disclosed that are obvious to persons of skill in the art are intended to be within the scope of the following claims. All patents and publications mentioned in the specification are indicative of the levels of skill of those skilled in the art to which the disclosure pertains. All references cited in this disclosure are incorporated by reference to the same extent as if each reference had been incorporated by reference in its entirety individually.

It is to be understood that the disclosure is not limited to particular methods or systems, which can, of course, vary. It is also to be understood that the terminology used herein is for the purpose of describing particular embodiments only and is not intended to be limiting. As used in this specification and the appended claims, the singular forms "a," "an," and "the" include plural referents unless the content clearly dictates otherwise. The term "plurality" includes two or more referents unless the content clearly dictates otherwise. Unless defined otherwise, all technical and scientific terms used herein have the same meaning as commonly understood by one of ordinary skill in the art to which the disclosure pertains.

The invention claimed is:

1. A high current heaterless hollow cathode, comprising:
a cathode tube having an inner cylindrical hollow space that defines a longitudinal extension of the high current heaterless hollow cathode;
a thermionic emitter arranged in a downstream region of the inner cylindrical hollow space of the cathode tube; and
a propellant feed tube that longitudinally extends from an upstream region of the inner cylindrical hollow space of the cathode tube into an inner volume of the thermionic emitter.

2. The high current heaterless hollow cathode of claim 1, wherein:
the thermionic emitter has a length along the longitudinal extension, and
the propellant feed tube longitudinally extends into the inner volume of the thermionic emitter by a length that is in a range from one quarter to three quarters of the length of the thermionic emitter.

3. The high current heaterless hollow cathode of claim 1, wherein:
the propellant feed tube is made from a refractory metal material capable of withstanding temperatures that are above 2200 degrees Celsius.

4. The high current heaterless hollow cathode of claim 3, wherein:
at said temperatures, the refractory metal material is capable of thermionic emission of an electron current in a range from one to six amperes.

5. The high current heaterless hollow cathode of claim 1, wherein:
the propellant feed tube is made from tantalum, tungsten, molybdenum or other refractory metals.

6. The high current heaterless hollow cathode of claim 1, wherein:
the thermionic emitter is made from a thermionic material comprising barium oxide impregnated porous tungsten (BaO—W), or lanthanum hexaboride (LaB$_6$), or a thermionic material capable of supplying electron current at elevated temperatures.

7. The high current heaterless hollow cathode of claim 6, wherein:
the elevated temperatures include a range from 1100 to 1700 degrees Celsius.

8. The high current heaterless hollow cathode of claim 1, wherein:
a geometry of the thermionic emitter is configured to supply an electron current in a range from 35 to 300 amperes.

9. The high current heaterless hollow cathode of claim 8, wherein:
a length of the thermionic emitter along the longitudinal extension is in a range from 2.0 cm to 5.0 cm, and
an inner diameter of the thermionic emitter is in a range from 0.50 cm to 1.30 cm.

10. The high current heaterless hollow cathode of claim 1, wherein:
a geometry of the thermionic emitter is configured to supply an electron current in a range from 35 to 50 amperes.

11. The high current heaterless hollow cathode of claim 10, wherein:
a length of the thermionic emitter along the longitudinal extension is in a range from 2.0 cm to 3.0 cm, and
an inner diameter of the thermionic emitter is in a range from 0.40 cm to 0.50 cm.

12. The high current heaterless hollow cathode of claim 1, wherein:
the cathode tube, the thermionic emitter and the feed tube are concentrically aligned along a centerline of the cathode tube.

13. The high current heaterless hollow cathode of claim 1, further comprising:
an alignment ring arranged in the inner cylindrical hollow space of the cathode tube upstream the thermionic emitter, the alignment ring comprising a center hole for passage of the feed tube.

14. The high current heaterless hollow cathode of claim 13, further comprising:
a pusher comprising a hollow cylindrical structure arranged in the inner cylindrical hollow space of the cathode tube upstream the alignment ring; and a pusher spring arranged in the inner cylindrical hollow space of the cathode tube upstream the pusher, wherein a combination of the pusher and the pusher spring is configured to push the alignment ring toward the thermionic emitter.

15. The high current heaterless hollow cathode of claim 1, further comprising: a planar backplate structure having a first surface in contact with the cathode tube at an upstream end of the cathode tube, the backplate comprising a center hole for feeding of propellant to the propellant feed tube.

16. The high current heaterless hollow cathode of claim 15, wherein:

an upstream end of the propellant feed tube is attached to the backplate structure.

17. The high current heaterless hollow cathode of claim 15, wherein:

the feeding of the propellant is provided through an external propellant feed tube attached to the backplate structure at a second surface of the backplate structure that is opposite the first surface.

18. An electric propulsion device comprising: a high temperature heaterless hollow cathode according to claim 1, wherein the electric propulsion device is a gridded ion thruster or a Hall thruster.

19. A method for reliably producing a high discharge current in a heaterless hollow cathode, the method comprising:

providing a thermionic emitter;

fitting the thermionic emitter into a cathode tube, thereby obtaining the heaterless hollow cathode;

fitting a propellant feed tube made from a refractory metal into the cathode tube, the propellant feed tube extending into an inner volume of the thermionic emitter;

partially surrounding the heaterless hollow cathode with a keeper electrode;

applying a potential difference between the heaterless hollow cathode and the keeper electrode; and based on the applying, generating an electric discharge that is electrically coupled to an end of the propellant feed tube located in the inner volume of the thermionic emitter, the electric discharge being a Paschen discharge.

20. The method according to the claim 19, wherein:

based on the generating, elevating a temperature of the refractory metal at said end of the propellant feed tube to above 2200 degrees Celsius;

based on the elevating, radiating heat to the thermionic emitter, thereby causing thermionic emission of the high discharge current from the heaterless hollow cathode.

* * * * *